(12) United States Patent
Song et al.

(10) Patent No.: US 10,460,633 B2
(45) Date of Patent: Oct. 29, 2019

(54) PIXEL ARRAY, DISPLAY SUBSTRATE AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Jie Song, Beijing (CN); Honggang Gu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 92 days.

(21) Appl. No.: 15/561,868

(22) PCT Filed: Feb. 17, 2017

(86) PCT No.: PCT/CN2017/073876
§ 371 (c)(1),
(2) Date: Sep. 26, 2017

(87) PCT Pub. No.: WO2017/206548
PCT Pub. Date: Dec. 7, 2017

(65) Prior Publication Data
US 2018/0197442 A1 Jul. 12, 2018

(30) Foreign Application Priority Data
Jun. 1, 2016 (CN) .......................... 2016 1 0383318

(51) Int. Cl.
*G09F 9/302* (2006.01)
*G02F 1/1335* (2006.01)
(Continued)

(52) U.S. Cl.
CPC ........ *G09F 9/302* (2013.01); *G02F 1/133514* (2013.01); *G02F 1/134309* (2013.01);
(Continued)

(58) Field of Classification Search
CPC ............... H01L 27/3218; H01L 27/326; H01L 27/3262; G02F 2001/134345;
(Continued)

(56) References Cited

U.S. PATENT DOCUMENTS

2006/0290870 A1\* 12/2006 Kwak ............... G02F 1/133514
349/144
2007/0075627 A1\* 4/2007 Kimura ............... H01L 27/3213
313/503
(Continued)

FOREIGN PATENT DOCUMENTS

CN 1725274 A 1/2006
CN 104123904 A 10/2014
(Continued)

OTHER PUBLICATIONS

The International Search Report and Written Opinion dated May 2, 2017; PCT/CN2017/073876.
(Continued)

*Primary Examiner* — Charles D Garber
*Assistant Examiner* — Alia Sabur

(57) ABSTRACT

A pixel array, a display substrate and a display device are provided, the pixel array includes a plurality of pixel units, each pixel unit includes a plurality of windmill-shaped sub-pixels, each windmill-shaped sub-pixel is configured to display one primary color, each windmill-shaped sub-pixel includes a plurality of separated parts which are disposed around a center position of this windmill-shaped sub-pixel, and the plurality of separated parts are disposed apart from each other; between two adjacent separated parts of each
(Continued)

windmill-shaped sub-pixel, a separated part of an adjacent windmill-shaped sub-pixel is disposed.

19 Claims, 7 Drawing Sheets

(51) Int. Cl.
*H01L 27/32* (2006.01)
*G02F 1/1343* (2006.01)

(52) U.S. Cl.
CPC .............. *H01L 27/3218* (2013.01); *G02F 2001/134345* (2013.01); *G02F 2201/52* (2013.01); *H01L 27/3213* (2013.01)

(58) Field of Classification Search
CPC ........ G02F 2201/52; G09G 2300/0443; H09G 2300/0452; H09F 3/2088
See application file for complete search history.

(56) References Cited

U.S. PATENT DOCUMENTS

| | | | |
|---|---|---|---|
| 2010/0134909 A1* | 6/2010 | Lin | G02B 5/201 359/891 |
| 2016/0217726 A1 | 7/2016 | Guo et al. | |
| 2017/0017110 A1 | 1/2017 | Wei | |

FOREIGN PATENT DOCUMENTS

| | | |
|---|---|---|
| CN | 104517541 A | 4/2015 |
| CN | 106097898 A | 11/2016 |
| JP | 2007-017477 A | 1/2007 |
| KR | 1020020045701 A | 6/2002 |

OTHER PUBLICATIONS

The Second Chinese Office Action dated Dec. 11, 2018; Appln. No. 201610383318.1.

* cited by examiner

PIXEL ARRAY, DISPLAY SUBSTRATE AND DISPLAY DEVICE

TECHNICAL FIELD

Embodiments of the present disclosure relate to a pixel array, a display substrate and a display device.

BACKGROUND

Liquid crystal devices and OLEDs (i.e., organic light-emitting diodes) display device are two common types of display devices. In the display device, each of basic display units, which can display various colors, namely pixel dots (also refers to pixels or pixel units), is implemented by a plurality of sub-pixels displaying primary colors, light of the primary colors emitted by the sub-pixels can be mixed with each other to obtain different colors. For example, each pixel unit can comprise one red sub-pixel, one green sub-pixel and one blue sub-pixel, and such mode is called an RGB mode. For example, each pixel unit can comprise one red sub-pixel, one green sub-pixel, one blue sub-pixel and one white sub-pixel, and such mode is called an RGBW mode.

SUMMARY

Embodiments of the present disclosure provide a pixel array, a display substrate and a display device, so as to improve the resolution of a display device.

At least one embodiment of the present disclosure provides a pixel array, which comprises a plurality of pixel units. each pixel unit comprises a plurality of windmill-shaped sub-pixels, each windmill-shaped sub-pixel is configured to display one primary color, each windmill-shaped sub-pixel comprises a plurality of separated parts which are disposed around a center position of this windmill-shaped sub-pixel, and the plurality of separated parts are disposed apart from each other, and between two adjacent separated parts of each windmill-shaped sub-pixel, a separated part of an adjacent windmill-shaped sub-pixel is disposed.

For example, plane shapes of the plurality of separated parts of each windmill-shaped sub-pixel are same.

For example, at the center position, angels between the plurality of separated parts of each windmill-shaped sub-pixel are equal.

For example, edges, which are adjacent to each other, of adjacent pixel units are parallel to each other.

For example, each pixel unit comprises windmill-shaped sub-pixels for at least three different colors, and the windmill-shaped sub-pixels for each color are adjacent to at least the windmill-shaped sub-pixels for other two colors.

For example, the windmill-shaped sub-pixels for the at least three different colors comprise a red sub-pixel, a green sub-pixel and a blue sub-pixel.

For example, each windmill-shaped sub-pixel comprises four separated parts.

For example, in a case that each windmill-shaped sub-pixel comprises four separated parts, centers of the windmill-shaped sub-pixels for the at least three different colors of each pixel unit are arranged along a straight line; or the centers of the windmill-shaped sub-pixels for the at least three different colors of each pixel unit are arranged in a manner that a polygon is formed in a case that the centers are sequentially connected with each other.

For example, a plane shape of each separated part is a triangle.

For example, each windmill-shaped sub-pixel comprises two separated parts, three separated parts or four separated parts.

For example, in a case that each windmill-shaped sub-pixel comprises two separated parts or three separated parts, a plane shape of each pixel unit is a regular hexagon.

For example, a material used to form each separated part comprises a color filter material.

For example, each separated part comprises a light-emitting device, and the light-emitting device comprises a first electrode and a second electrode which are disposed opposite to each other, and a light-emitting functional layer disposed between the first electrode and the second electrode.

For example, the pixel array further comprises a plurality of switching components, and a plurality of gate lines and a plurality of data lines; the plurality of gate lines and the plurality of data lines are intersected with each other and are electrically connected with the plurality of switching components respectively, each windmill-shaped sub-pixel comprises a corresponding switching component to collectively control a state of working of the plurality of separated parts of this windmill-shaped sub-pixel.

For example, the switching component of each windmill-shaped sub-pixel is disposed at the center position of this windmill-shaped sub-pixel.

For example, each windmill-shaped sub-pixel comprises a connecting portion, and the connecting portion is connected with each separated part and the switching component.

For example, the pixel array further comprises a black matrix; the black matrix is configured to shield a gap between adjacent windmill-shaped sub-pixels.

At least one embodiment of the present disclosure further provide a display substrate, which comprises a pixel array with a plurality of pixel units; each pixel unit comprises a plurality of windmill-shaped sub-pixels, each windmill-shaped sub-pixel is configured to display one primary color, each windmill-shaped sub-pixel comprises a plurality of separated parts which are disposed around a center position of this windmill-shaped sub-pixel, and the plurality of separated parts are disposed apart from each other, and between two adjacent separated parts of each windmill-shaped sub-pixel, a separated part of an adjacent windmill-shaped sub-pixel is disposed.

For example, the display substrate is an array substrate.

For example, the display substrate is a color filter substrate.

At least one embodiment of the present disclosure further provides a display device; the display device comprises any one of the above-mentioned pixel arrays or any one of the above-mentioned display substrates.

Embodiments of the present disclosure provide a pixel array, a display substrate and a display device. The pixel array comprises a plurality of pixel units, each pixel unit comprises a plurality of windmill-shaped sub-pixels, each windmill-shaped sub-pixel is configured to display one primary color, each windmill-shaped sub-pixel comprises a plurality of separated parts which are disposed around a center position of this windmill-shaped sub-pixel, and the plurality of separated parts are disposed apart from each other, and between two adjacent separated parts of each windmill-shaped sub-pixel, a separated part of a windmill-shaped sub-pixel, which is adjacent with this windmill-shaped sub-pixel (a number of the windmill-shaped sub-pixel, which is adjacent with this windmill-shaped sub-pixel, can be one or more), is disposed. On the one hand, a size of the windmill-shaped sub-pixel can be smaller because the windmill-shaped sub-pixel formed with a plurality of separated parts is adopted, so that the embodiment of the present disclosure can improve the resolution of the display device; on the other hand, between two adjacent separated parts of each windmill-shaped sub-pixel, a separated part of an adjacent windmill-shaped sub-pixel is disposed, and this makes displayed images to have a better color-mixing effect and to be more stereo. Due to at least one aspect of the above-mentioned two aspects, the embodiment of the present disclosure can improve the display effect of the display device.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 2b is a top schematic view of a pixel unit of the pixel array illustrated in FIG. 2a;

FIG. 3a is a first top schematic view of a windmill-shaped sub-pixel of the pixel array illustrated in FIG. 2a;

FIG. 3b is a second top schematic view of a windmill-shaped sub-pixel of the pixel array illustrated in FIG. 2a;

FIG. 4a is a first sectional schematic diagram along A-A line in FIG. 2a;

FIG. 4b is a second sectional schematic diagram along A-A line in FIG. 2a;

FIG. 6b to FIG. 6d respectively are top schematic views of each windmill-shaped sub-pixel of the pixel array illustrated in FIG. 6a;

FIG. 7b to FIG. 7e respectively are top schematic views of each windmill-shaped sub-pixel of the pixel array illustrated in FIG. 7a.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, one person skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," and so on which are used in the description and the claims of the present application for invention, are not intended to indicate any sequence, amount or importance, but distinguish various components. The terms "comprises," "comprising," "includes," "including," etc., are intended to specify that the components or the objects stated before these terms encompass the components or the objects and equivalents thereof listed after these terms, but do not preclude the other components or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
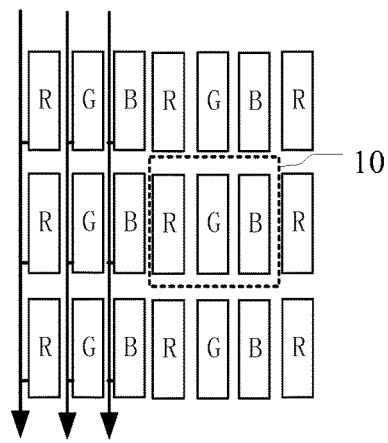
FIG. 1a to FIG. 1c respectively are schematic diagrams of a pixel array adopting an RGB mode.
Figure 1B:
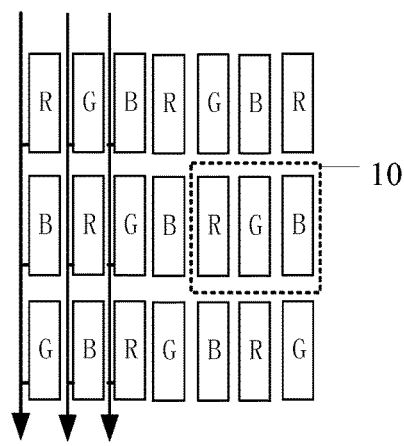
Figure 1C:
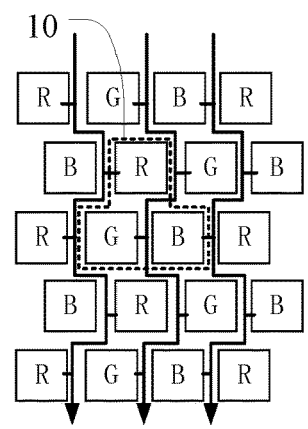

FIG. 1a to FIG. 1c respectively illustrate a pixel array adopting an RGB mode. As illustrated in FIG. 1a to FIG. 1c, the pixel array comprises a plurality of pixel units 10, and each pixel unit 10 comprises one red sub-pixel R, one green sub-pixel G and one blue sub-pixel B.

In order to improve visual effect, people's requirements on the resolution (namely, the number of pixels per a unit size) of a display device are raised; this requires a size of the sub-pixel to be smaller and smaller. However, as for the pixel array illustrated in FIG. 1a to FIG. 1c, the size reduction of the sub-pixel is limited by manufacturing processes.

Embodiments of the present disclosure provide a pixel array, a display substrate and a display device. The pixel array comprises a plurality of pixel units. each pixel unit comprises a plurality of windmill-shaped sub-pixels, each windmill-shaped sub-pixel is configured to display one primary color, each windmill-shaped sub-pixel comprises a plurality of separated parts which are disposed around a center position of this windmill-shaped sub-pixel, and the plurality of separated parts are disposed apart from each other; and between two adjacent separated parts of each windmill-shaped sub-pixel, a separated part of a windmill-shaped sub-pixel, which is adjacent with this windmill-shaped sub-pixel (a number of the windmill-shaped sub-pixel which is adjacent with this windmill-shaped sub-pixel can be one or more), is disposed. On the one hand, a size of the windmill-shaped sub-pixel can be smaller because the windmill-shaped sub-pixel formed with the plurality of separated parts is adopted, so that the embodiment of the present disclosure can improve the resolution of the display device; on the other hand, between two adjacent separated parts of each windmill-shaped sub-pixel, a separated part of an adjacent windmill-shaped sub-pixel is disposed, and this makes displayed images have a better color-mixing effect and to be more stereo. Due to at least one aspect of the above-mentioned two aspects, the embodiment of the present disclosure can improve the display effect of the display device.

For example, each pixel unit can comprise windmill-shaped sub-pixels for at least three different colors, and the windmill-shaped sub-pixels for each color are adjacent to at least the windmill-shaped sub-pixels for other two colors. For example, the windmill-shaped sub-pixels for the at least three different colors can comprise a red sub-pixel, a green sub-pixel and a blue sub-pixel. For example, common types of color combination mode in the art, such as an RGB mode or an RGBW mode, can be adopted.

For example, each windmill-shaped sub-pixel can comprise two separated parts, three separated parts or four separated parts. Apparently, according to actual demands, each windmill-shaped sub-pixel can also comprise more separated parts.

In the following, the cases that each windmill-shaped sub-pixel comprises two separated parts, three separated parts or four separated parts are respectively taken as an example, the pixel array, the display substrate and the display device provided by the embodiments of the present disclosure are described in detail with reference to the drawings.

First Embodiment

Figure 2A:
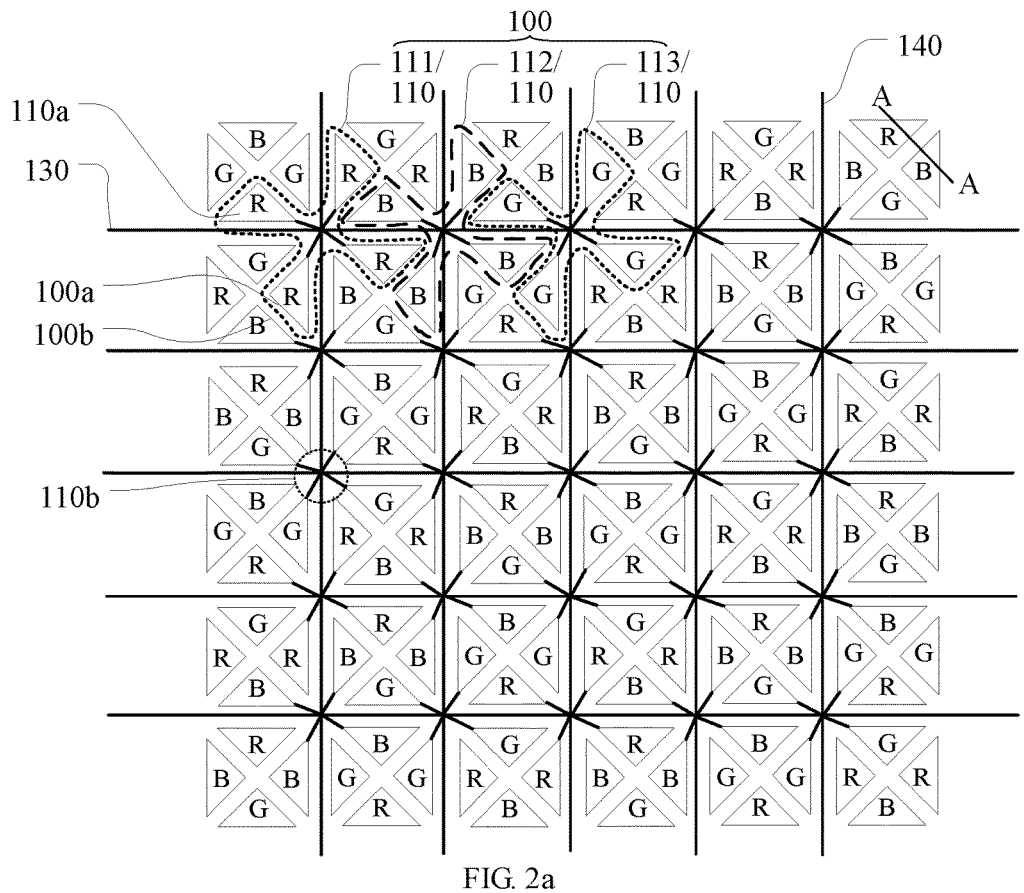
FIG. 2a is a top schematic view of a pixel array provided by an embodiment of the present disclosure.
Figure 2B:
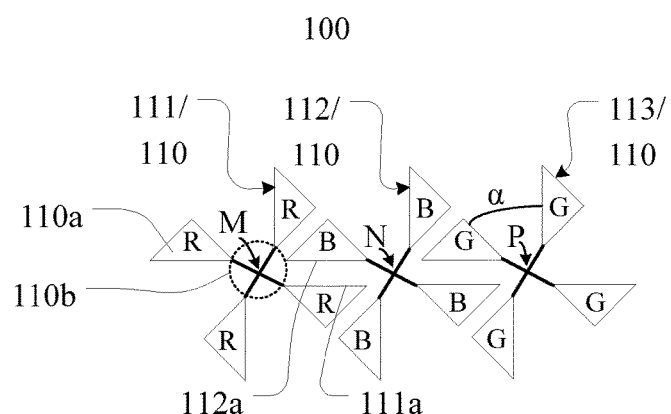

As illustrated in FIG. 2a and FIG. 2b, the present embodiment provides a pixel array, which comprises a plurality of pixel units 100, each of the pixel units 100 comprises a plurality of windmill-shaped sub-pixels 110, and each windmill-shaped sub-pixel 110 is configured to display one primary color. The present embodiment is described by taking a case that each of the pixel units 100 comprises three windmill-shaped sub-pixels 110, and the three windmill-shaped sub-pixels 110 are respectively a red sub-pixels 111, a blue sub-pixel 112 and a green sub-pixel 113 (that is, the three windmill-shaped sub-pixels are configured to display red R, green G and blue B respectively) as an example. As illustrated in FIG. 2a, in an obtained pixel array, the sub-pixels in each row are arranged according to an arrangement mode of RBGRBG, and at the same time, the sub-pixels in each column are arranged according to the arrangement mode of RBGRBG; the row/column herein is defined by the following method, that is, a center position of each sub-pixel is referred as the row/column of this sub-pixel. However, in the embodiment of the present disclosure, the pixel array is not limited to be arranged according to the above-mentioned arrangement mode; for example, the sub-pixels in each column can have a same color, meanwhile the sub-pixels in each row are arranged according to the arrangement mode of RBGRBG.

Each windmill-shaped sub-pixel 110 comprises a plurality of separated parts 110a (in the embodiment, taking four separated parts as an example) which are disposed around a center position (illustrated by M, N, P in FIG. 2b) of this windmill-shaped sub-pixel 110 and the plurality of separated parts are disposed apart from each other. For example, as illustrated in FIG. 2b, at the center position, angels α (namely, angles between adjacent edges of adjacent separated parts 110a) between the plurality of separated parts 110a of each windmill-shaped sub-pixel 110 can be equal. For example, plane shapes of the plurality of separated parts 110a of each windmill-shaped sub-pixel 110 can be the same (namely, graph outlines of separated parts can be the same, and areas of the plurality of separated parts can be the same); for example, the plane shape of each separated part 110a can be a triangle. Apparently, according to actual situation, the separated part with other plane shape can also be adopted. A design method of the position and the plane shape of the above-mentioned separated parts 110a can make the structure of the windmill-shaped sub-pixels to be simpler, so as to simplify the structure of the pixel array.

Between two adjacent separated parts 110a of each windmill-shaped sub-pixel 110, a separated part 110a of an adjacent windmill-shaped sub-pixel 110 is disposed. For example, as illustrated in FIG. 2b, between a group of adjacent separated parts B of the windmill-shaped sub-pixel 112, a separated part R of an adjacent windmill-shaped sub-pixel 111 is disposed, and between another group of adjacent separated parts B of the windmill-shaped sub-pixel 112, a separated part G of an adjacent windmill-shaped sub-pixel 113 is disposed; apparently, the windmill-shaped sub-pixel 111 and 113 also have similar arrangements.

For example, edges, which are adjacent to each other, of adjacent pixel units 110 can be parallel to each other. For example, as illustrated in FIG. 2a, a partially edge 100a of a pixel unit 100 and a partially edge 100b of another pixel unit (not labeled in FIG. 2a) can be parallel to each other, and the partially edge 100a and the partially edge 100b are adjacent to each other; apparently, other edges (not labeled in FIG. 2a), which are adjacent to each other, of the two pixel units can also have similar arrangement. By such arrangement, adjacent pixel units can be arranged more compactly, so as to be in favor of improving the display effect.

For example, as illustrated in FIG. 2a, the pixel array provided by at least one embodiment of the present disclosure can further comprises a plurality of switching components 110b, a plurality of gate lines 130 and a plurality of data lines 140, the plurality of gate lines 130 and the plurality of data lines 140 are intersected with each other and are electrically connected with the plurality of switching components 110b respectively, each windmill-shaped sub-pixel 110 comprises a corresponding switching component 110b to collectively control a state of working of the separated parts 110a of this windmill-shaped sub-pixel 110. That is to say, each windmill-shaped sub-pixel 110 controls the plurality of separated parts 110a of this windmill-shaped sub-pixel 110 to be in a working state simultaneously or to be in a non-working state simultaneously by the switching component 110b of this windmill-shaped sub-pixel 110.

For example, as illustrated in FIG. 2b, the switching component 110b of each windmill-shaped sub-pixel 110 can be disposed at the center position (refer to M, N, P illustrated in FIG. 2b) of this windmill-shaped sub-pixel 110. So that the switching component 110b of each windmill-shaped sub-pixel 110 is conveniently connected to corresponding separated parts 110a.

Figure 3A:
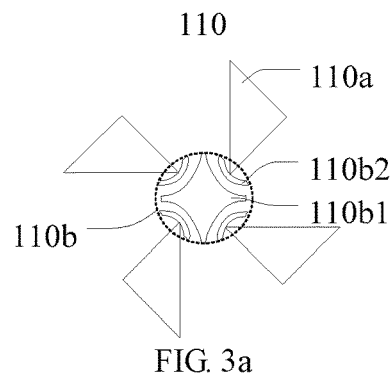

For example, the switching component 110b can be a switching transistor or a micro-electro-mechanical system (MEMS) switch. For example, as illustrated in FIG. 3a, in a case that the switching component 110b is a switching transistor (for example, a thin film transistor), the switching transistor can comprise a source electrode 110b1 and a plurality of drain electrodes 110b2 disposed apart from each other, a number of the drain electrodes 110b2 is the same with a number of the separated parts 110a of the windmill-shaped sub-pixel 110 which comprises the switching component 110b. For example, the switching transistor can be an N-type transistor or a P-type transistor. For example, the source electrode 110b1 of the switching transistor can be connected with a corresponding data line. Apparently, the switching transistor can also comprise an active layer connected to the source electrode and the drain electrodes, and can further comprise a gate insulating layer, a gate electrode disposed apart from the active layer through the gate insulating layer, and other structures (the structures are not illustrated in FIG. 3a); the gate electrode is connected to a corresponding gate line, so as to be connected to a drive circuit.

For example, a process that the pixel array provided by the embodiment controls a state of working of the windmill-shaped sub-pixel comprises: in one frame, scanning the gate lines in turn; as for the windmill-shaped sub-pixel of the j-th column of the pixel array, in a case of scanning the gate line of the i-th row, controlling the switching component, which is connected to the gate line of the i-th row and is connected to the data line connected with the windmill-shaped sub-pixel of the j-th column, to be switched on, so that the windmill-shaped sub-pixel (namely, the windmill-shaped sub-pixel at the i-th row and the j-th column) adjacent to the switching component is in the working state.

Figure 3B:
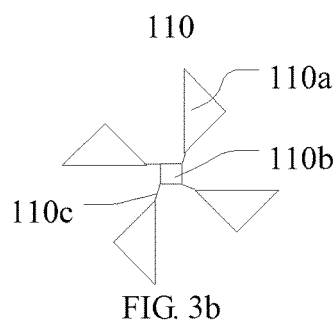

For example, as illustrated in FIG. 3b, each windmill-shaped sub-pixel 110 can further comprise a connecting portion 110c, and the connecting portion 110c is connected to each separated part 110a and the switching component 110b). For example, the connecting portion 110c can be a conductive structure, such as a wire. The switching component 110b can be formed more easily by adopting the connecting portion 110c.

For example, the pixel array provided by at least one example of the embodiment can further comprise a black matrix, and the black matrix can shield a gap between adjacent windmill-shaped sub-pixels, so as to avoid cross-talk between adjacent windmill-shaped sub-pixels. Apparently, the black matrix can also shield the gate lines and the data lines of the pixel array, so as to avoid an adverse influence of the gate lines and the data lines on the display effect.

For example, in at least one example of the embodiment, the pixel array can be realized by a passive type light-emitting display panel, such as a liquid crystal panel, etc., and also can be realized by an active type light-emitting display substrate, such as an organic light-emitting diode (OLED) substrate, etc. The pixel array is described in detail below with reference to FIG. 4a and FIG. 4b.

Figure 4A:
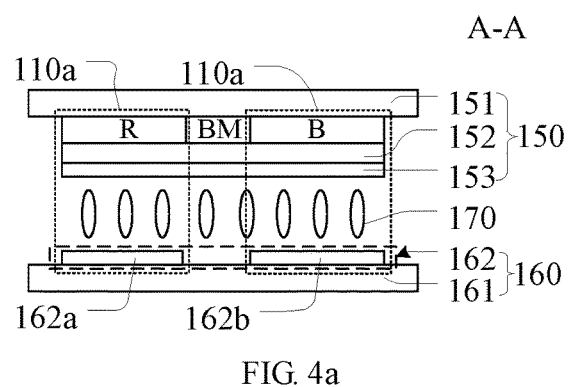

For example, as illustrated in FIG. 4a, in a case that the pixel array is realized by a liquid crystal panel, the pixel array can comprise a first substrate 150 and a second substrate 160 disposed opposite to each other, the pixel array can further comprise a liquid crystal layer 170 disposed between the first substrate 150 and the second substrate 160. For example, the first substrate 150 can be a color filter substrate; the first substrate 150 can comprise, for example, a first base substrate 151, a color filter layer disposed on the first base substrate 151 (refer to a layer, where a red filter material R and a blue filter material B are located, in FIG. 4a, apparently, the color filter layer can also comprise a green filter material), a black matrix BM, a planarization layer 152 and a common electrode layer 153. For example, the second substrate 160 can be an array substrate, the second substrate 160 can comprise a second base substrate 161 and a pixel electrode layer 162 disposed on the second base substrate 161, the pixel electrode layer 162, for example, comprises a plurality of pixel electrodes (FIG. 4a only illustrates a pixel electrode 162a and a pixel electrode 162b) disposed apart from each other. The array substrate can also comprise gate lines, data lines and switching components (not shown in FIG. 4a) electrically connected to the above-mentioned pixel electrodes respectively.

It should be noted that, FIG. 4a is taking a case that the color filter layer and the black matrix are located on a same substrate and the common electrode layer and the pixel electrode layer are located on different substrates respectively as an example to describe, apparently, the color filter layer and the black matrix can be disposed on different substrates, and the common electrode layer and the pixel electrode layer can be disposed on the same substrate, which is not limited herein. The arrangements of the gate lines, the data lines and the switching components can be referred to the above description, the repetition of which will not be elaborated herein.

For example, as illustrated in FIG. 4a, a forming material of each separated part 110a can comprise the color filter material, for example, the red filter material R or the blue filter material B. FIG. 4a only illustrates two separated parts 110a including the red filter material R and the blue filter material B respectively, Apparently, the pixel array is further provided with a separated part including the green filter material. For example, in such a case, by making the separated parts of a same windmill-shaped sub-pixel to include the color filter material with a same color, this windmill-shaped sub-pixel being used for displaying one primary color can be realized.

For example, as illustrated in FIG. 4a, the separated parts 110a belonging to different windmill-shaped sub-pixels comprise different pixel electrodes (such as a pixel electrode 162a and a pixel electrode 162b illustrated in FIG. 4a), controlling of each windmill-shaped sub-pixel can be realized by making the pixel electrodes included in the separated parts 110a of a same windmill-shaped sub-pixel to be connected to a same switching component (not shown in FIG. 4a) and making the pixel electrodes included in the separated parts 110a of different windmill-shaped sub-pixels to be connected to different switching components (not shown in FIG. 4a) respectively.

Figure 4B:
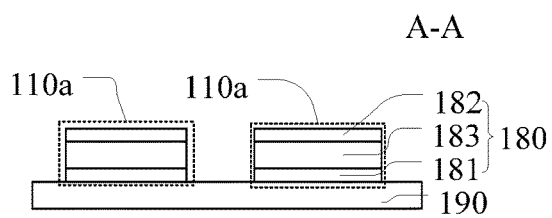

For example, as illustrated in FIG. 4b, in a case that the pixel array is realized by an active type light-emitting display substrate, such as an OLED substrate, etc., each separated part 110a can comprise a light-emitting device 180, the light-emitting device 180 comprises a first electrode 181 and a second electrode 182 disposed opposite to each other, and a light-emitting functional layer 183 disposed between the first electrode 181 and the second electrode 182. For example, the light-emitting device 180 can be an OLED type light-emitting device or a LED type light-emitting device and the like. The light-emitting device 180 can emit light with a desired color according to the settings of the light-emitting device 180; in such a case, for example, by making the light-emitting devices included in the separated parts belonging to a same windmill-shaped sub-pixel to be electrically connected (for example, be electrically connected by a switching component) with each other, this windmill-shaped sub-pixel being used for displaying one primary color can be realized. FIG. 4b only illustrates two separated parts 110a disposed on a base substrate 190.

Figure 5A:
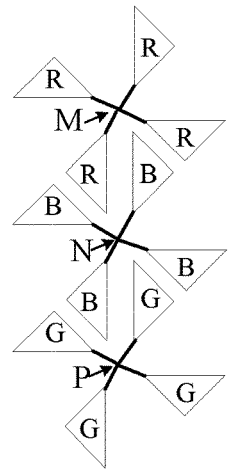
FIG. 5a and FIG. 5b respectively are schematic diagrams illustrating arrangements of windmill-shaped sub-pixels of a pixel unit of a pixel array provided by an embodiment of the present disclosure.
Figure 5B:
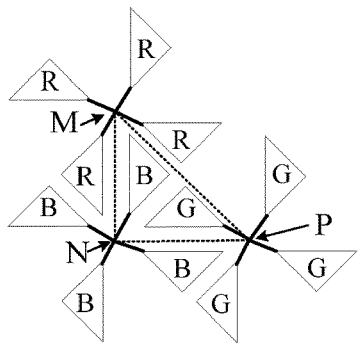

In FIG. 2a and FIG. 2b, centers (refer to M, N, P illustrated in FIG. 2b) of the windmill-shaped sub-pixels 110 for different colors of each pixel unit 100 are arranged along a straight line, such as along a direction parallel to the gate lines 130 as illustrated in FIG. 2a. It should be noted that, the arrangement mode of the windmill-shaped sub-pixels comprises but is not limited to the arrangement mode illustrated in FIG. 2a and FIG. 2b. For example, as illustrated in FIG. 5a, the centers (refer to M, N, P illustrated in FIG. 5a) of the windmill-shaped sub-pixels 110 for different colors of each pixel unit 100 can also be arranged along a direction parallel to the data lines 140 illustrated in FIG. 2a; or, as illustrated in FIG. 5b, the centers (refer to M, N, P illustrated in FIG. 5b) of the windmill-shaped sub-pixels 110 for different colors of each pixel unit 100 can also be arranged in a manner that a triangle is formed in a case that the centers are sequentially connected with each other, namely in a delta ($\Delta$) arrangement mode. Apparently, in a case that each of the pixel units 100 comprises more windmill-shaped sub-pixels 110, the centers of these the windmill-shaped sub-pixels can be arranged in a manner that a polygon is formed in a case that the centers are sequentially connected with each other.

Second Embodiment

Figure 6A:
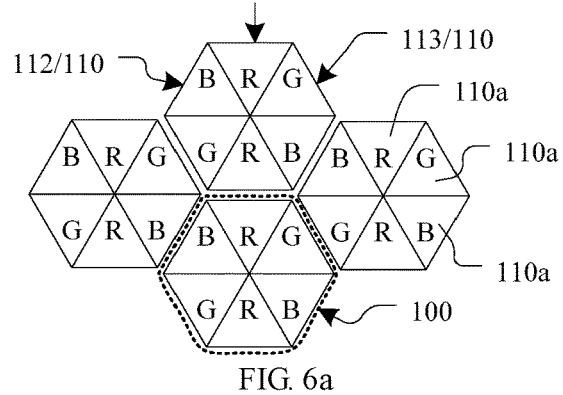
FIG. 6a is a top schematic view of another pixel array provided by an embodiment of the present disclosure.
Figure 6B:
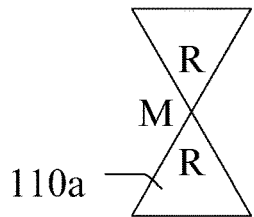
Figure 6C:
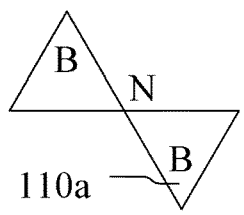
Figure 6D:
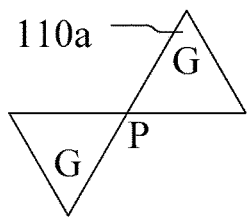

As illustrated in FIG. 6a and FIG. 6d, the embodiment provides a pixel array, which comprises a plurality of pixel units 100 (only four pixel units 100 are illustrated in FIG. 6a), each of the pixel units 100 comprises three windmill-shaped sub-pixels 110, and each windmill-shaped sub-pixel 110 is configured to display one primary color. The embodiment is described by taking a case that the three windmill-shaped sub-pixels 110 of each pixel unit 100 are a red sub-pixel 111, a blue sub-pixel 112 and a green sub-pixel 113 respectively (that is, the three windmill-shaped sub-pixels are configured to display red R, green G and blue B respectively) as an example.

It should be noted that, a gap is disposed between adjacent windmill-shaped sub-pixels, for example, the gap can be shielded by a black matrix (the gap and the black matrix are not shown in FIG. 6a).

Each windmill-shaped sub-pixel 110 comprises two separated parts 110a which are disposed around a center position (such as M, N, P illustrated in FIG. 6b to FIG. 6d) of this windmill-shaped sub-pixel 110, and the two separated parts are disposed apart from each other. Between two adjacent separated parts 110a of each windmill-shaped sub-pixel 10, a separated part 110a of an adjacent windmill-shaped sub-pixel 110 is disposed. For example, as illustrated in FIG. 6a, between two adjacent separated parts R of a windmill-shaped sub-pixel 111, two separated parts B of an adjacent windmill-shaped sub-pixel 112 and two separated parts G of an adjacent windmill-shaped sub-pixel 113 are disposed; the windmill-shaped sub-pixel 112 and the windmill-shaped sub-pixel 113 also have similar arrangements.

For example, a plane shape of each of the pixel units 100 can be a regular hexagon. For example, edges, which are adjacent to each other, of adjacent pixel units can be parallel to each other. By such arrangements, adjacent pixel units 100 can be arranged more compactly, so as to be in favor of improving the display effect.

The pixel array provided by the embodiment can further comprise switching components, gate lines, data lines and other structures. The arrangements of these structures can be referred to relevant descriptions in the first embodiment, the repetition of which will not be elaborated here.

Third Embodiment

Figure 7A:
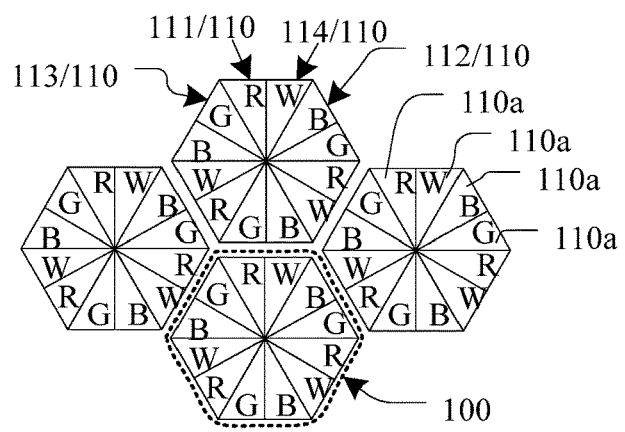
FIG. 7a is a top schematic view of further another pixel array provided by an embodiment of the present disclosure.
Figure 7B:
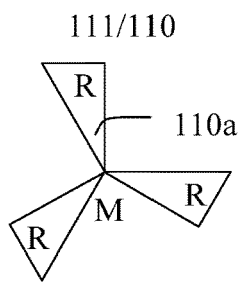
Figure 7C:
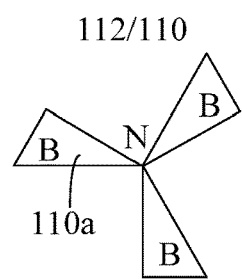
Figure 7D:
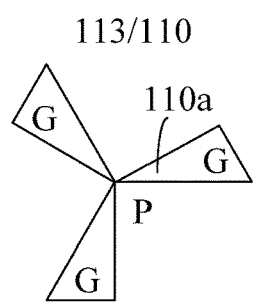
Figure 7E:
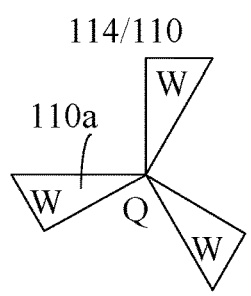

As illustrated in FIG. 7a and FIG. 7e, the embodiment provides a pixel array, which comprises a plurality of pixel units 100 (only four pixel units 100 are illustrated in FIG. 7a), each of the pixel units 100 comprises four windmill-shaped sub-pixels 110, and each windmill-shaped sub-pixel 110 is configured to display one primary color. The embodiment is described by taking a case that the four windmill-shaped sub-pixels 110 of each pixel unit 100 are a red sub-pixel 111, a blue sub-pixel 112, a green sub-pixel 113 and a white sub-pixel 114 respectively (that is, the four windmill-shaped sub-pixels are configured to display red R, green G, blue B and white W respectively) as an example.

It should be noted that, a gap is disposed between adjacent windmill-shaped sub-pixels, for example, the gap can be shielded by a black matrix (the gap and the black matrix are not shown in FIG. 7a).

Each windmill-shaped sub-pixel 110 comprises three separated parts 110a which are disposed around a center position (such as M, N, P, Q illustrated in FIG. 7b to FIG. 7e) of this windmill-shaped sub-pixel 110, and the three separated parts are disposed apart from each other. Between two adjacent separated parts 110a of each windmill-shaped sub-pixel 110, a separated part 110a of an adjacent windmill-shaped sub-pixel 110 is disposed. For example, as illustrated in FIG. 7a, between two adjacent separated part R of a windmill-shaped sub-pixel 111, a separated part G of an adjacent windmill-shaped sub-pixel 113 and a separated part W of an adjacent windmill-shaped sub-pixel 114 are disposed; between two adjacent separated part G of a windmill-shaped sub-pixel 113, a separated part B of an adjacent windmill-shaped sub-pixel 112 and a separated part R of an adjacent windmill-shaped sub-pixel 111 are disposed; similarly, the windmill-shaped sub-pixel 112 and the windmill-shaped sub-pixel 114 also have the similar arrangements.

For example, a plane shape of each of the pixel units 100 can be a regular hexagon. For example, edges, which are adjacent to each other, of adjacent pixel units 100 can be parallel to each other. By such arrangements, the adjacent pixel units 100 can be arranged more compactly, so as to be in favor of improving the display effect.

The pixel array provided by the embodiment can further comprise switching components, gate lines, data lines and other structures. The arrangements of these structures can be referred to relevant descriptions in the first embodiment, the repetition of which will not be elaborated here.

Fourth Embodiment

The embodiment provides a display substrate, comprising a pixel array with a plurality of pixel units, as illustrated in FIG. 2a, FIG. 6a and FIG. 7a, each of the pixel units 100 comprises a plurality of windmill-shaped sub-pixels 110, each windmill-shaped sub-pixel 110 is configured to display one primary color, and each windmill-shaped sub-pixel 110 comprises a plurality of separated parts 110a which are disposed around a center position of this windmill-shaped sub-pixel and the plurality of separated parts are disposed apart from each other; between two adjacent separated parts 110a of the windmill-shaped sub-pixel 110, a separated part 110a of an adjacent windmill-shaped sub-pixel 110 is disposed.

For example, the display substrate provided by at least one example of the embodiment can be an array substrate.

For example, the array substrate can be an array substrate used in a passive type light-emitting display device, such as a liquid crystal display device, etc. In such a case, for example, each windmill-shaped sub-pixel can comprise a plurality of pixel electrodes electrically connected with each other. For example, the plurality of pixel electrodes can be implemented as the above-mentioned separated parts, for example, the plurality of pixel electrodes can be electrically connected with each other by switching components (such as switching transistors).

For example, the array substrate can be an active type light-emitting display substrate, such as an OLED substrate, etc. In such a case, each windmill-shaped sub-pixel can comprise a plurality of light-emitting devices, such as OLED type light-emitting devices or LED type light-emitting devices and the like. For example, the plurality of light-emitting devices can be implemented as the above-mentioned separated parts, for example, the plurality of light-emitting devices can be electrically connected with each other by the switching components (such as the switching transistors).

Figure 8:
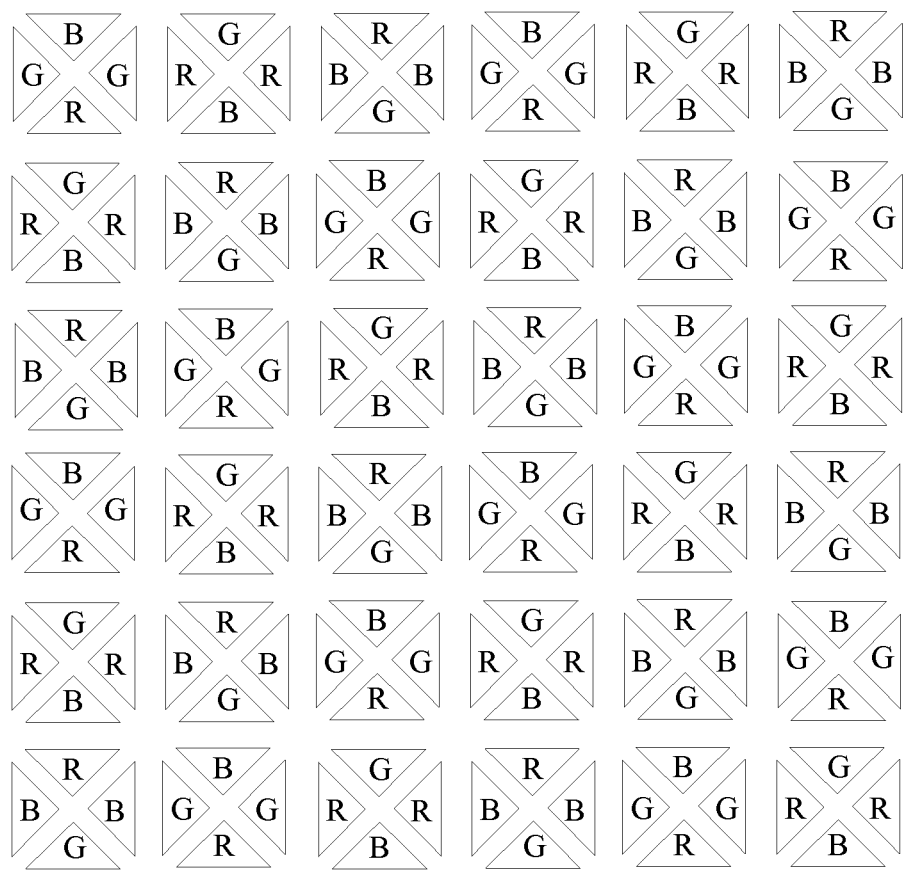
FIG. 8 is a top schematic view of a color filter layer of a display substrate provided by an embodiment of the present disclosure in a case that the display substrate is a color filter substrate.

For example, the display substrate provided by at least one example of the embodiment can be a color filter substrate. For example, the color filter substrate can comprise color filter layers illustrated in FIG. 8, for example, the color filter layers can comprise a red filter layer R, a green filter layer G and a blue filter layer B. The color filter layers illustrated in FIG. 8 can be used in a pixel array illustrated in FIG. 2*a*. Apparently, the color filter layers of the color filter substrate can also be set with reference to the pixel arrays illustrated in FIG. 6*a* and FIG. 7*a*. Apparently, the color filter substrate can also comprise other structures, for example, the color filter substrate can comprise a black matrix disposed between filter layers with different colors. A sectional view of partially color filter substrate can be referred to the first substrate 150 illustrated in FIG. 4*a*.

Fifth Embodiment

The embodiment provides a display device, which comprises any one of the above-mentioned pixel arrays or display substrates. For example, the display device can be a liquid crystal panel, an electronic paper, an OLED panel, a mobile phone, a tablet computer, a television, a monitor, a notebook computer, a digital photo frame, a GPS, or any product or components having display function.

The accompanying drawings involve only the structure(s) in connection with the embodiment(s) of the present disclosure, and other structure(s) can be referred to common design(s). In embodiments of the present disclosure, same structures can be referred to each other. In a case of no conflict, the embodiments of present disclosure can be combined and features in the embodiments can be combined.

What are described above is related to the illustrative embodiments of the present disclosure only and not limitative to the scope of the disclosure; the scopes of the disclosure are defined by the accompanying claims.

The application claims priority to the Chinese patent application No. 201610383318.1, filed Jun. 1, 2016, the entire disclosure of which is incorporated herein by reference as part of the present application.

What is claimed is:

1. A pixel array, comprising a plurality of pixel units, wherein each pixel unit comprises a plurality of windmill-shaped sub-pixels,
   each windmill-shaped sub-pixel is configured to display one primary color,
   each windmill-shaped sub-pixel comprises a plurality of separated parts which are disposed around a center position of this windmill-shaped sub-pixel, and the plurality of separated parts are disposed apart from each other,
   between two adjacent separated parts of each windmill-shaped sub-pixel, a separated part of an adjacent windmill-shaped sub-pixel is disposed,
   each pixel unit comprises windmill-shaped sub-pixels for at least three different colors,
   the windmill-shaped sub-pixels for each color are adjacent to at least the windmill-shaped sub-pixels for two other colors, and
   each windmill-shaped sub-pixel comprises four separated parts.

2. The pixel array according to claim 1, wherein centers of the windmill-shaped sub-pixels for the at least three different colors of each pixel unit are arranged along a straight line; or the centers of the windmill-shaped sub-pixels for the at least three different colors of each pixel unit are arranged in a manner that a polygon is formed and the centers are sequentially connected with each other.

3. A pixel array, comprising a plurality of pixel units, wherein each pixel unit comprises a plurality of windmill-shaped sub-pixels,
   each windmill-shaped sub-pixel is configured to display one primary color,
   each windmill-shaped sub-pixel comprises a plurality of separated parts which are disposed around a center position of this windmill-shaped sub-pixel, and the plurality of separated parts are disposed apart from each other,
   between two adjacent separated parts of each windmill-shaped sub-pixel, a separated part of an adjacent windmill-shaped sub-pixel is disposed, the pixel array, further comprises:
   a plurality of switching components, and a plurality of gate lines and a plurality of data lines,
   the plurality of gate lines and the plurality of data lines are intersected with each other and are electrically connected with the plurality of switching components respectively,
   each windmill-shaped sub-pixel comprises a corresponding switching component to collectively control a state of working of the plurality of separated parts of this windmill-shaped sub-pixel.

4. The pixel array according to claim 3, wherein plane shapes of the plurality of separated parts of each windmill-shaped sub-pixel are the same.

5. The pixel array according to claim 4, wherein
   at the center position, angles between adjacent edges of adjacent separated parts of the plurality of separated parts of each windmill-shaped sub-pixel are equal.

6. The pixel array according to claim 3, wherein edges, which are adjacent to each other, of adjacent pixel units are parallel to each other.

7. The pixel array according to claim 3, wherein
   each pixel unit comprises windmill-shaped sub-pixels for at least three different colors, and
   the windmill-shaped sub-pixels for each color are adjacent to at least the windmill-shaped sub-pixels for two other colors.

8. The pixel array according to claim 7, wherein
   the windmill-shaped sub-pixels for the at least three different colors comprise a red sub-pixel, a green sub-pixel and a blue sub-pixel.

9. The pixel array according to claim 3, wherein
   a plane shape of each separated part is a triangle.

10. The pixel array according to claim 3, wherein
    each windmill-shaped sub-pixel comprises two separated parts, three separated parts or four separated parts.

11. The pixel array according to claim 10, wherein
    each windmill-shaped sub-pixel comprises two separated parts or three separated parts, a plane shape of each pixel unit is a regular hexagon.

12. The pixel array according to claim 3, wherein
    a material used to form each separated part comprises a color filter material.

13. The pixel array according to claim 3, wherein
    each separated part comprises a light-emitting device, and the light-emitting device comprises a first electrode and a second electrode which are disposed opposite to each other, and a light-emitting functional layer disposed between the first electrode and the second electrode.

14. The pixel array according to claim 3, wherein
the switching component of each windmill-shaped sub-pixel is disposed at the center position of this windmill-shaped sub-pixel.

15. The pixel array according to claim 3, wherein
each windmill-shaped sub-pixel comprises a connecting portion, and the connecting portion is connected with each separated part and the switching component.

16. The pixel array according to claim 3, further comprising a black matrix, wherein
the black matrix is configured to shield a gap between adjacent windmill-shaped sub-pixels.

17. A display device, comprising a pixel array according to claim 3.

18. A display substrate, comprising a pixel array with a plurality of pixel units, wherein
each pixel unit comprises a plurality of windmill-shaped sub-pixels,
each windmill-shaped sub-pixel is configured to display one primary color,
each windmill-shaped sub-pixel comprises a plurality of separated parts which are disposed around a center position of this windmill-shaped sub-pixel, and the plurality of separated parts are disposed apart from each other, and
between two adjacent separated parts of each windmill-shaped sub-pixel, a separated part of an adjacent windmill-shaped sub-pixel is disposed,
the pixel array further comprises: a plurality of switching components, and a plurality of gate lines and a plurality of data lines,
the plurality of gate lines and the plurality of data lines are intersected with each other and are electrically connected with the plurality of switching components respectively, and
each windmill-shaped sub-pixel comprises a corresponding switching component to collectively control a state of working of the plurality of separated parts of this windmill-shaped sub-pixel.

19. The display substrate according to claim 18, wherein the display substrate is an array substrate or is a color filter substrate.

* * * * *